United States Patent

Kondo et al.

[11] Patent Number: 5,258,716
[45] Date of Patent: Nov. 2, 1993

[54] ALL-PASS FILTER

[75] Inventors: Hiroshi Kondo; Tsuneo Tohyama; Hiroshi Tanigawa; Isao Fukai, all of Tsurugashima, Japan

[73] Assignee: Toko, Inc., Tokyo, Japan

[21] Appl. No.: 913,868

[22] Filed: Jul. 15, 1992

[30] Foreign Application Priority Data

Jul. 19, 1991 [JP] Japan .................. 3-64181[U]

[51] Int. Cl.$^5$ .............................................. H03F 1/34
[52] U.S. Cl. ...................................... 330/85; 330/107; 330/151; 330/306
[58] Field of Search ................ 307/520; 328/167; 330/85, 107, 109, 126, 151, 294, 305, 306

[56] References Cited

FOREIGN PATENT DOCUMENTS 2030021 3/1980 United Kingdom ................ 328/167

OTHER PUBLICATIONS

Trapnell et al, "Wideband Amplifier", *IBM Technical Disclosure Bulletin*, vol. 2, No. 5, Feb. 1960, p. 40.

*Primary Examiner*—James B. Mullins

[57] ABSTRACT

An all-pass filter includes an adder which comprises a variable conductance amplifier and a capacitor connected to the output terminal thereof. The adder is being arranged to add the output of a band pass filter and an input signal together.

1 Claim, 4 Drawing Sheets

ALL-PASS FILTER

BACKGROUND OF THE INVENTION

1. Field of the Invention

This invention relates to an all-pass filter which is designed such that the amplitude characteristic thereof is flattened with the group delay characteristic being maintained at constant value.

2. Description of the Prior Art

To have a better understanding of the present invention, description will first be made of an example of conventional all-pass filter with reference to FIG. 1 of the accompanying drawings, which comprises an integrator 3 constituted by a self negative feedback type variable conductance amplifier $A_1$ and capacitor $C_1$; another integrator 4 constituted by a variable conductance amplifier $A_2$ and capacitor $C_2$; and an adder 6. Such a conventional all-pass filter (referred to as APF hereinafter) is characterized in that a peak occurs in the high frequency region of the cut-off frequency domain as shown in FIG. 5 representing the amplitude characteristic thereof, when the ratio of high frequency pole to $\omega_0$ of the integrators, i.e., components thereof is low, so that there may occur such a situation that the amplitude characteristic thereof does not turn out to be flat. There is a tendency that the worse the parameters such as amplification factor, cut-off frequency or the like of the elements constituting the active filter, the more remarkably deteriorated are the characteristics of the filter.

The conventional APF is disadvantageous in that the amplitude characteristic thereof tends to rise at the high frequency portion of the cut-off frequency domain due to dispersions of parameters such as amplification factor, cut-off frequency and so forth of the elements constituting the filter.

SUMMARY OF THE INVENTION

Accordingly, it is an object of the present invention to provide an all-pass filter (APF) which is designed such that even when the elements constituting the APF represent inferior parameters, the amplitude characteristic thereof can be flattened with the group delay characteristic thereof being maintained at constant value.

Briefly stated, the APF according to the present invention comprises an adder for adding the output of a band pass filter and an input signal to each other, the adder comprising a variable conductance amplifier having a capacitor connected to the output terminal thereof.

In the APF according to the present invention, as means for eliminating a peak of the amplitude characteristic which tends to occur in the high cut-off frequency region, the adder is constituted by a variable conductance amplifier as mentioned above, and is equipped with an integrating function. Further, the amplitude characteristic of the present APF is flattened with the group delay characteristic thereof being maintained at constant value as mentioned above, by adjusting the conductance value of the variable conductance amplifier through adjustment of operating current of the integrator to change its own pole.

As described above, the all-pass filter according to the present invention comprises an adder which is constituted by a variable conductance amplifier, and an integrator which is constituted by a variable conductance amplifier and a capacitor, and is equipped with integrating function, whereby the amplitude characteristic of the present all-pass filter, even when it represents a peak at the high frequency portion of the cut-off frequency region, can be flattened with the group delay characteristic thereof being maintained invariable, by controlling to reduce the operating current of the variable conductance amplifiers.

Other objects, features and advantages of the present invention will become apparent from the ensuing description taken in conjunction with the accompanying drawings.

DESCRIPTION OF THE PREFERRED EMBODIMENTS

Figure 1:
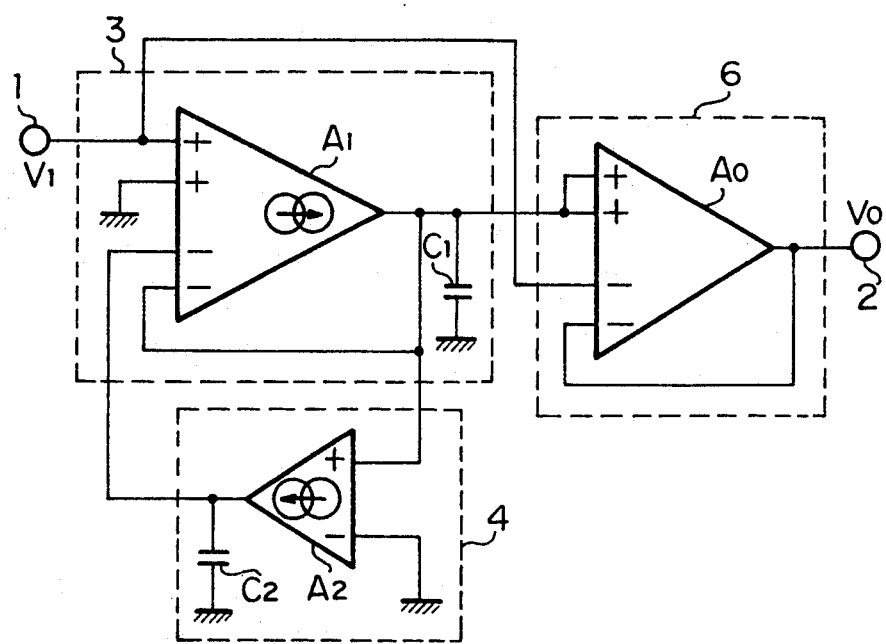
FIG. 1 is a circuit diagram showing an example of conventional all-pass filter.
Figure 2:
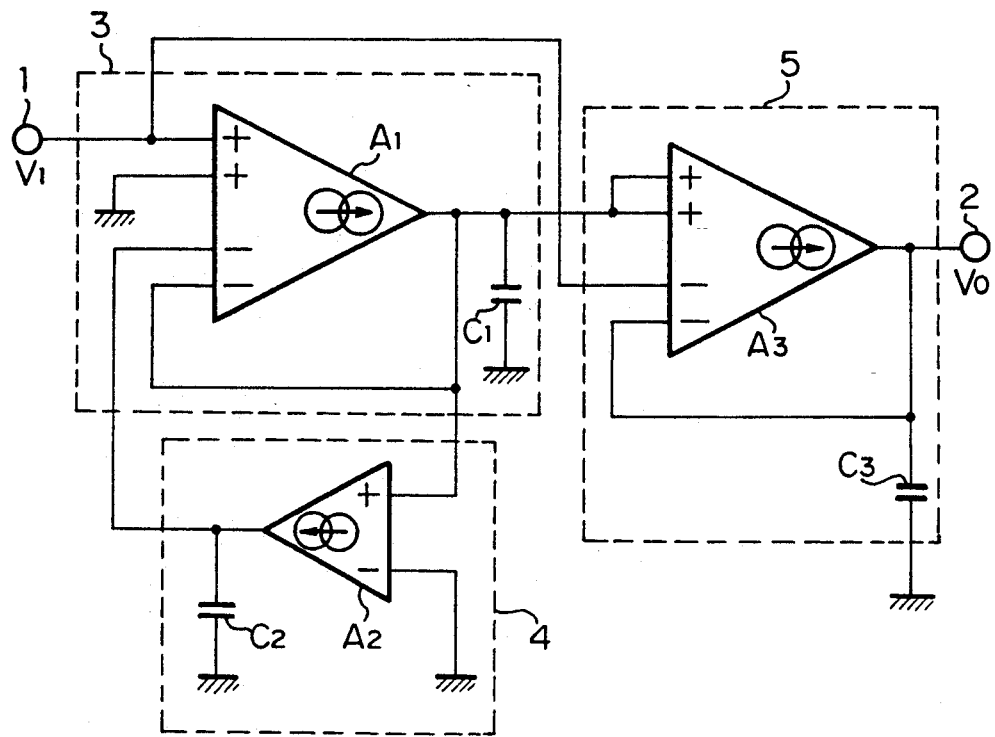
FIG. 2 is a circuit diagram showing the all-pass filter according to an embodiment of the present invention.

Referring to FIG. 2, there is shown the APF according to an embodiment of the present invention, which is a secondary APF comprising a primary APF and a secondary low pass filter (referred to as LPF hereinafter).

In this embodiment, an input terminal 1 is connected to a first non-inverting input terminal of a self feedback type variable conductance amplifier $A_1$ having a second non-inverting input terminal grounded, and a capacitor $C_1$ is connected to the output terminal of the variable conductance amplifier $A_1$ so that an integrator 3 is provided. Further, the output terminal of the integrator 3 is connected to a non-inverting input terminal of a second variable conductance amplifier $A_2$, and a second capacitor $C_2$ is connected to the output terminal of the variable conductance amplifier $A_2$ so that a second integrator 4 is provided. The output terminal of the integrator 4 is connected to a first inverting input terminal of the variable conductance amplifier $A_1$ constructed in the form of a self negative feedback circuit.

Furthermore, the output terminal of the integrator 3 is connected to two non-inverting input terminals of a self negative feedback type variable conductance amplifier $A_3$, and a third capacitor $C_3$ is connected to the output terminal of the variable conductance amplifier $A_3$.

The input terminal 1 is also connected to a first inverting input terminal of the variable conductance amplifier $A_3$, the output terminal of which is connected to an output terminal 2. The variable conductance amplifier $A_3$ has the third capacitor $C_3$ connected to the output terminal thereof so as to form an adder 5, which is a variable conductance-adjustable type one and adapted to serve as integrator as well.

The secondary APF according to the present invention will now be explained with reference to the block diagram of FIG. 3, wherein it is assumed that input voltage is $V_1$; the transfer function $A(s)$ of the integrator 3 is $P_1/s$; and output voltage is $V_2$. It is also assumed that the transfer function $B(s)$ of the integrator 4 is $P_2/s$; the transfer function $C(s)$ of the adder 5 is 1, where $s = j\omega$; and the output voltage of the adder 5 is $V_0$. $P_1$ is $\omega_0/Q$, and $P_2$ is $Q\omega_0$, where $\omega_0$ is the center frequency and Q is the quality factor. Further, $P_1$ and $P_2$ are equal to $gm_1/C_1$ and $gm_2/C_2$, respectively. $gm_1$ and $gm_2$ are the transconductances of the variable conductance amplifiers constituting the integrators 3 and 4 respectively; and $C_1$ and $C_2$ are capacitance values for the capacitors of the integrators 3 and 4 respectively. Feedback voltage fed back to the integrator 3 is $-V_2 B(s)$.

Assuming that the transfer function of the band pass filter is H(s), the transfer function T(s) of the APF is given as follows:

$$T(s) = 1 - 2H(s) \quad (1)$$

The transfer function H(s) of the band pass filter is given as follows:

$$H(s) = (\omega_0 s/Q)/(s^2 + \omega_0 s/Q + \omega_0^2) \quad (2)$$

By substituting equation (2) for equation (1), the transfer function T(s) of the APF is given as follows:

$$\begin{aligned} T(s) &= 1 - 2[(\omega_0 s/Q)/(s^2 + \omega_0 s/Q + \omega_0^2)] \\ &= (s^2 - s\omega_0/Q + \omega_0^2)/(s^2 + s\omega_0/Q + \omega_0^2) \end{aligned} \quad (3)$$

Figure 3:
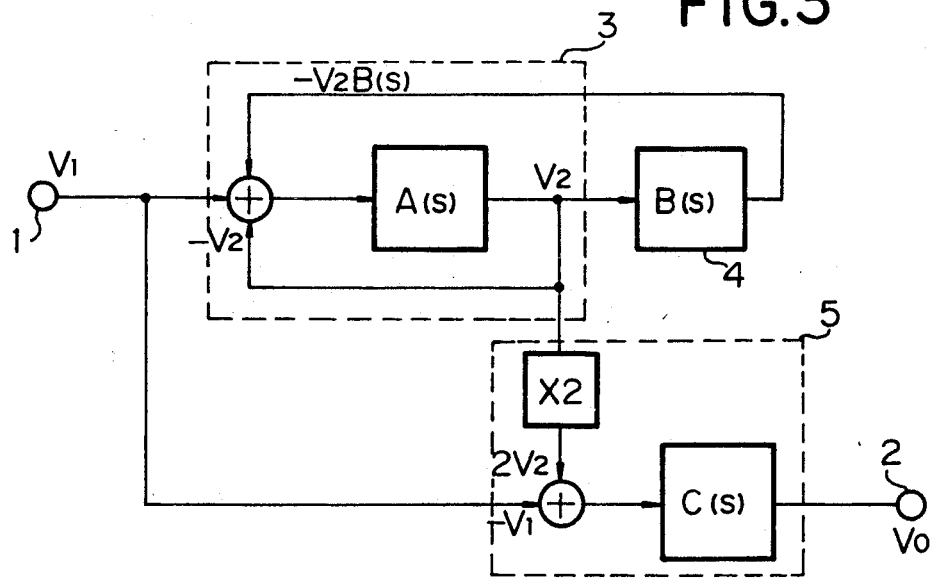
FIG. 3 is a block diagram useful for explaining the all-pass filter shown in FIG. 2.

The all-pass filter of FIG. 2 can be represented in the form of such a block diagram as shown in FIG. 3, and thus the transfer function T(s) thereof can be derived from FIG. 3 as follows:

$$T(s) = C(s) \cdot [1 - A(s) + A(s)B(s)]/[1 + A(s) + A(s)B(s)] \quad (4)$$

As will be appreciated from the above discussion, the transfer functions of the integrators 3, 4 and adder 5 may be expressed as follows respectively:

$$A(s) = \omega_0 s/Q$$

$$B(s) = Q\omega_0/s$$

$$C(s) = 1$$

By substituting these expressions for equation (1), the following equation (5) is obtained:

$$T(s) = (s^2 - s\omega_0/Q + \omega_0^2)/(s^2 + s\omega_0/Q + \omega_0^2) \quad (5)$$

From the fact that equation (5) is identical with equation (3), it will be confirmed that the embodiment of FIG. 2 provides an all-pass filter.

In an attempt to approximate the actual characteristics by the frequency characteristics of the integrators 3, 4 and adder 5, the following primary approximation is effected, and thus the respective transfer functions A(s), B(s) and C(s) constituting the APF of FIG. 2 are given as follows:

$$\begin{aligned} A(s) &= (\omega_0 s/Q)/(1 + s/\omega_A) \\ &= (j\omega_0/\omega Q)/(1 + j\omega/\omega_A) \end{aligned} \quad (6)$$

$$\begin{aligned} B(s) &= (Q\omega_0/s)/(1 + s/\omega_B) \\ &= (jQ\omega_0/\omega)/(1 + j\omega/\omega_B) \end{aligned} \quad (7)$$

$$C(s) = 1/(1 + s/\omega_C) = 1/(1 + j\omega/\omega_C) \quad (8)$$

Assuming that $\Omega = \omega/\omega_0$; $\Omega_A = \omega/\omega_A$; $\Omega_B = \omega/\omega_B$; and $\Omega_C = \omega/\omega_C$, then equations (6) to (8) can respectively be rewritten as follows:

$$A(s) = -(j/Q\Omega)/(1 + j\Omega_A) \quad (9)$$

$$B(s) = -(jQ/\Omega)/(1 + j\Omega_B) \quad (10)$$

$$C(s) = 1/(1 + j\Omega_C) \quad (11)$$

By substituting equations (9) to (11) for equation (4), the transfer function $T(\Omega)_{APF}$ of the all-pass filter embodying the present invention is given as follows:

$$T(\Omega)_{APF} = [(2(1 - j\Omega_C)/(1 + \Omega_C^2)(A^2 + B^2)] \cdot [(A\Omega_B - B \quad (12)$$

$$- Q\Omega(A^2 + B^2)/2) - j(B\Omega_B + A)]$$

Let it be assumed that:

$$C = A\Omega_B - B - Q\Omega(A^2 + B^2)/2$$

$$D = B\Omega_B + A$$

Then equation (12) can be rewritten as follows:

$$T(\Omega)_{APF} = 2[C - D\Omega_C - j(C\Omega_C + D)]/[Q\Omega(1 + \Omega_C^2)(A^2 + B^2)] \quad (13)$$

Thus, the absolute amplitude characteristic of APF is given as follows:

$$|T(\Omega)_{APF}| = 2[(C - D\Omega_C)^2 + (C\Omega_C + D)^2]^{\frac{1}{2}}/Q\Omega(1 + \Omega_C^2)(A^2 + B^2) \quad (14)$$

Meanwhile, the amount of phase shift of the APF is given as follows:

$$\beta(\Omega)_{APF} = \tan^{-1}(C\Omega_C + D)/(C - D\Omega_D) \quad (15)$$

The group delay time of the APF is given as follows:

$$\tau_{APF} = [(C\Omega_C + D)/(C - D\Omega_D)]/[(C\Omega_C + D)^2 + (C - D\Omega_D)^2] \quad (16)$$

Figure 4:
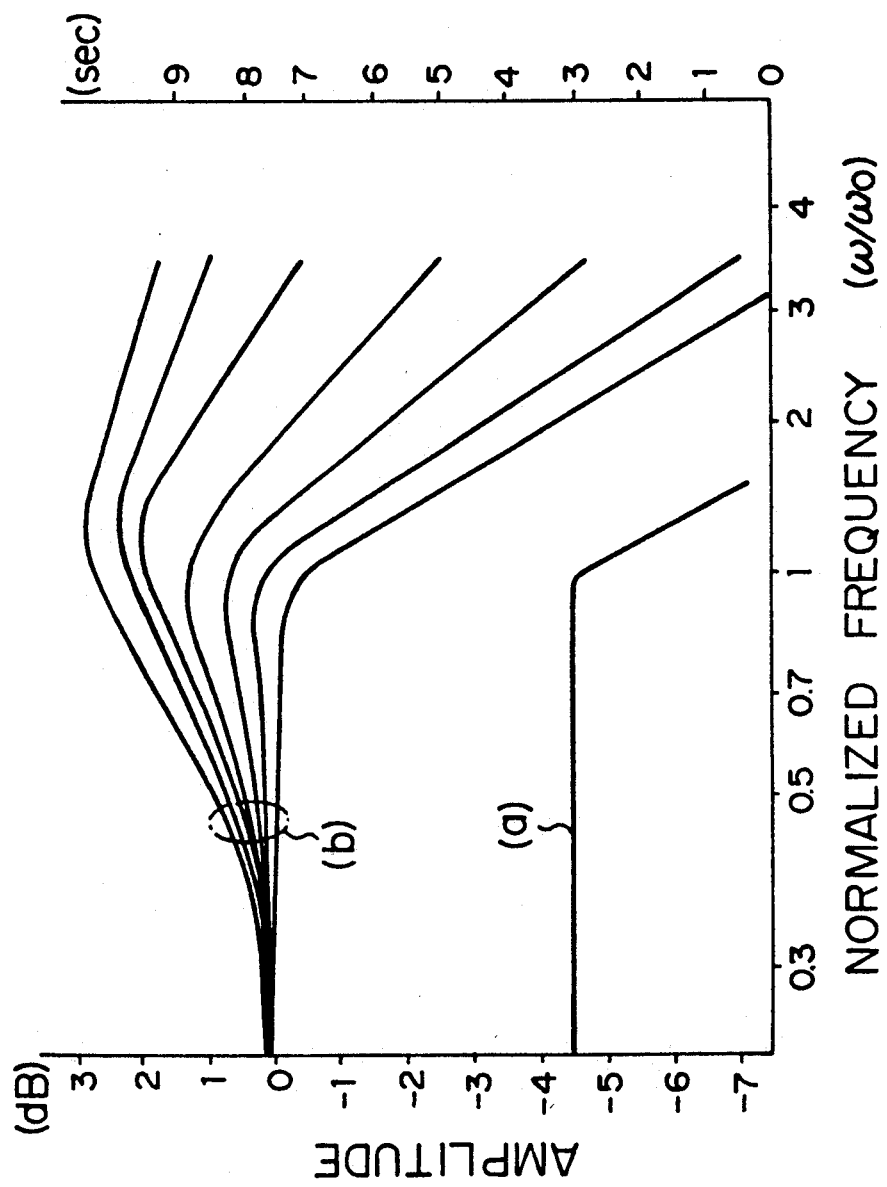
FIG. 4 illustrates the amplitude and group delay characteristics of the all-pass filter according to the present invention.
Figure 5:
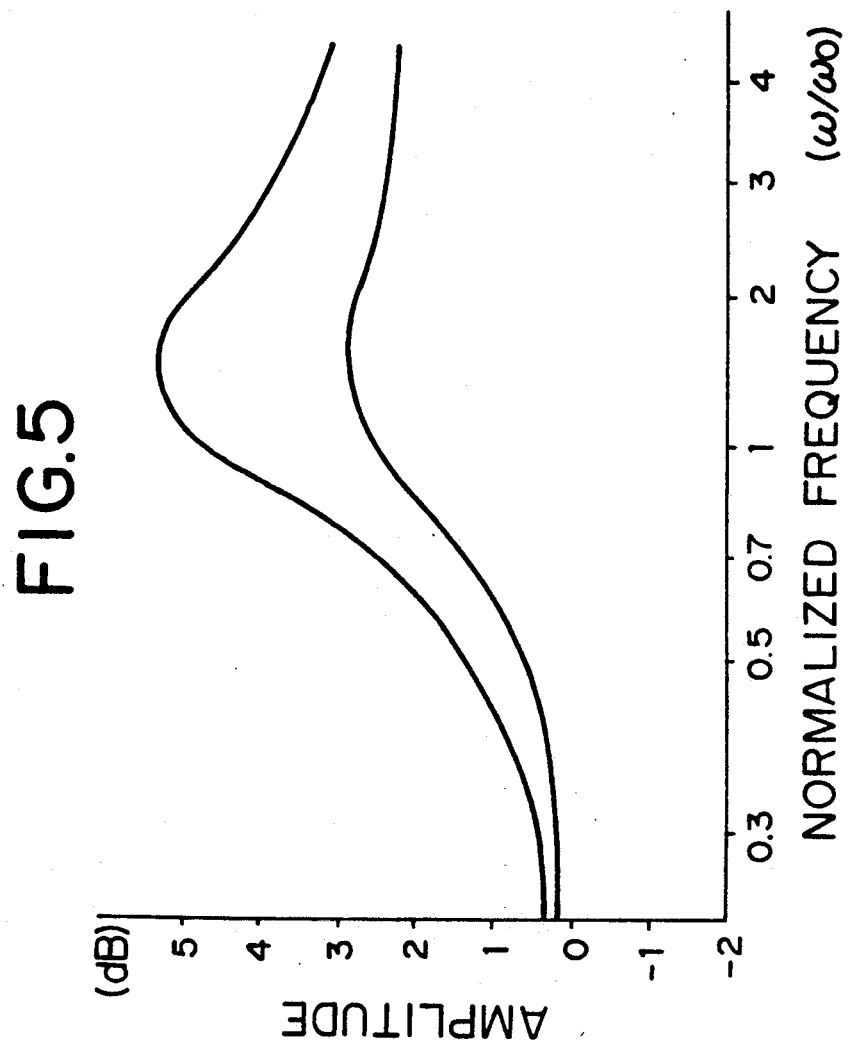
FIG. 5 illustrates the amplitude characteristic of the conventional all-pass filter.

Referring to FIG. 4, there are shown amplitude characteristics derived from simulation of the above-mentioned result, wherein the group delay characteristic of the all-pass filter embodying the present invention is represented at a, and the amplitude characteristics are indicated at b. As will be appreciated from FIG. 4, the frequency characteristics can be controlled by adjusting currents supplied to the variable conductance amplifiers $A_1$ to $A_3$. More specifically, the amplitude characteristic of the APF can be flattened by attenuating the currents supplied to the variable conductance amplifiers $A_1$, $A_2$ and $A_3$.

While the present invention has been illustrated and described with respect to specific embodiments thereof, it is to be understood that this invention is by no means limited thereto but encompasses all changes and modifications which will become possible without departing from the scope of the appended claims.

We claim:

1. An all-pass filter comprising:
    a first integrator comprising a first variable conductance amplifier of self negative feedback type, and a first capacitor connected to output terminal of said first variable conductance amplifier, an input terminal of said all-pass filter being taken out of an non-inverting input terminal of said first variable conductance amplifier;

a second integrator comprising a second variable conductance amplifier having a non-inverting input terminal connected to output terminal of said first integrator, and a second capacitor connected to output terminal of said second variable conductance amplifier, the output terminal of said second variable conductance amplifier being connected to an inverting input terminal of said first integrator; and an adder equipped with integrating function, said adder comprising a third variable conductance amplifier having an inverting input terminal connected to said input terminal of said all-pass filter and also having a first and a second non-inverting input terminal connected to the output terminal of said first integrator, and a third capacitor connected to output terminal of said third variable conductance amplifier, wherein the amplitude characteristic of said all-pass filter is controlled by adjusting operating currents of said first to third variable conductance amplifiers.

* * * * *